United States Patent
Wang

(10) Patent No.: US 8,969,844 B1
(45) Date of Patent: Mar. 3, 2015

(54) EMBEDDED RESISTORS FOR RESISTIVE RANDOM ACCESS MEMORY CELLS

(71) Applicant: Intermolecular Inc., San Jose, CA (US)

(72) Inventor: Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/139,476

(22) Filed: Dec. 23, 2013

(51) Int. Cl.
*H01L 29/02* (2006.01)
*H01L 45/00* (2006.01)

(52) U.S. Cl.
CPC ............ *H01L 45/06* (2013.01); *H01L 45/1616* (2013.01); *H01L 45/147* (2013.01); *H01L 45/1233* (2013.01); *H01L 45/1625* (2013.01)
USPC .............................................. 257/2; 438/382

(58) Field of Classification Search
CPC . H01L 45/165; H01L 45/1625; H01L 45/147; H01L 45/1616; H01L 27/2409
See application file for complete search history.

(56) References Cited

U.S. PATENT DOCUMENTS

| 2002/0030577 | A1 | 3/2002 | Shibuya | |
| 2004/0026682 | A1* | 2/2004 | Jiang | 257/4 |
| 2012/0235112 | A1* | 9/2012 | Huo et al. | 257/4 |
| 2013/0064002 | A1* | 3/2013 | Terai | 365/148 |
| 2013/0122680 | A1 | 5/2013 | Jo | |
| 2014/0353573 | A1* | 12/2014 | Kalra et al. | 257/5 |

OTHER PUBLICATIONS

Yang, L.M., et al.; Linear Scaling of Reset Current Down to 22nm Node for a Novel CuxSiy O RRAM; Jan. 1, 2013; IEEE; IEEE Electron Device Letters vol. 33 No. 1 pp. 8991.
Alvin A. Milgram, et al.; Electrical and Structural Properties of Mixed Chromium and SiliconMonoxide Films; ; AIP Applied Physics Letter.
Haitao Sun et al.; Overcoming the Dilemma Between RESET Current and Data Retention of RRAM by Lateral Dissolution of Conducting Filament; Jul. 1, 2013; IEEE Electron Device Letters.

* cited by examiner

*Primary Examiner* — Trung Q Dang

(57) ABSTRACT

Provided are resistive random access memory (ReRAM) cells and methods of fabricating thereof. The methods may include forming a first layer on a substrate, where the first layer is operable as a bottom electrode. The methods may also include forming a second layer, where the second layer includes a resistive portion and a resistive switching portion. The resistive portion may be configured to determine, at least in part, an electrical resistivity of the resistive switching non-volatile memory element. The resistive portion may have a substantially constant resistance. The resistive portion may include, at least in part, a conductive silicon oxide. The resistive switching portion may be configured to switch between a first resistive state and a second resistive state. The resistive switching portion may include, at least in part, silicon oxide. The methods may also include forming a third layer, where the third layer is operable as a top electrode.

20 Claims, 7 Drawing Sheets

EMBEDDED RESISTORS FOR RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells and methods of fabricating thereof. The methods may include forming a first layer on a substrate. The first layer may be operable as a bottom electrode. The methods may also include forming a second layer on top of the first layer. The second layer may include a resistive portion and a resistive switching portion. In some embodiments, the resistive portion may be configured to determine, at least in part, an electrical resistivity of the resistive switching nonvolatile memory element. The resistive portion may have a substantially constant resistance. Moreover, the resistive portion may include, at least in part, a conductive silicon oxide. For example, the resistive portion may include any of chromium silicon oxide, molybdenum silicon oxide, tungsten silicon oxide, niobium silicon oxide, titanium silicon oxide, tantalum silicon oxide, and ruthenium silicon oxide. In some embodiments, the resistive switching portion may be configured to switch between at least a first resistive state and a second resistive state. The resistive switching portion may include, at least in part, silicon oxide. The methods may also include forming a third layer on top of the second layer. The third layer may be operable as a top electrode.

In some embodiments, the conductive silicon oxide of the resistive portion of the second layer is silicon rich and has an atomic ratio of oxygen to silicon of less than about 1. Furthermore, the silicon oxide of the resistive switching portion of the second layer may be silicon rich and may have an atomic ratio of oxygen to silicon of less than about 1.

In some embodiments, forming the resistive portion of the second layer and forming the resistive switching portion of the second layer are parts of a continuous deposition operation. The continuous deposition operation may be a chemical vapor deposition process in which forming the second layer includes exposing the substrate to one or more precursors that may include silicon and chromium. In some embodiments, the continuous deposition operation may be an atomic layer deposition process in which forming the second layer includes exposing the substrate to a chromium containing precursor, and exposing the substrate to a silicon containing precursor. According to some embodiments, the continuous deposition operation is a physical vapor deposition process in which forming the second layer includes sputtering a chromium containing target and a silicon containing target, and reducing a ratio of power applied to the chromium containing target to power applied to the silicon containing target. In some embodiments, a portion of the second layer in between the resistive portion and the resistive switching portion has a gradient concentration of chromium. In some embodiments, the resistive portion may have a thickness of about 10 nm, and the resistive switching portion may have a thickness of between about 1 nm to 2 nm.

Also disclosed herein are methods for forming a resistive switching nonvolatile memory element that may include forming a first layer on a substrate, where the first layer is operable as a bottom electrode. The methods may also include forming a second layer on top of the first layer. The second layer may include a metal oxide capable of providing oxygen vacancies during operation of the resistive switching nonvolatile memory element. The methods may further include forming a third layer on top of the second layer. The third layer may include a resistive portion and a resistive switching portion. In some embodiments, the resistive portion may be configured to determine, at least in part, an electrical resistivity of the nonvolatile memory element. Moreover, the resistive portion may have a substantially constant resistance. Furthermore, the resistive portion may include, at least in part, conductive silicon oxide. In some embodiments, the resistive switching portion may be configured to switch between at least a first resistive state and a second resistive state. The resistive switching portion may include, at least in part, silicon oxide.

In some embodiments, the conductive silicon oxide of the resistive portion of the third layer is oxygen rich and has a ratio of silicon to oxygen of less than about 1. Furthermore, the silicon oxide of the switching portion of the second layer may be silicon rich and may have a ratio of oxygen to silicon that is less than about 1.

According to some embodiments, forming the resistive portion of the third layer and forming the resistive switching portion of the third layer are part of a continuous deposition operation. In some embodiments, the same continuous deposition operation is a chemical vapor deposition process in which forming the third layer includes exposing the substrate to one or more precursors comprising silicon oxide and chromium. According to some embodiments, the continuous deposition operation is an atomic layer deposition process in which forming the third layer includes exposing the substrate to a chromium containing precursor and exposing the substrate to a silicon containing precursor. In some embodiments, the continuous deposition operation is a physical vapor deposition process in which forming the third layer includes sputtering a chromium containing target and a silicon containing target, and increasing a ratio of power applied to the chromium containing target to power applied to the silicon containing target. In some embodiments, a portion of the third layer in between the resistive portion and the resistive switching portion may have a gradient concentration of chromium. In some embodiments, the resistive portion has a thickness of about 10 nm, and the resistive switching portion has a thickness of between about 1 nm to 2 nm.

Also disclosed herein are resistive switching nonvolatile memory elements that may include a substrate and a first layer formed on the substrate. In some embodiments, the first layer may be operable as a bottom electrode. The nonvolatile memory elements may further include a second layer formed on top of the first layer. The second layer may include a resistive portion and a resistive switching portion. The resistive portion may be configured to determine, at least in part, an electrical resistivity of the nonvolatile memory element. The resistive portion may have a substantially constant resistance. Furthermore, the resistive portion may include, at least in part, conductive silicon oxide. In some embodiments, the resistive switching portion may be configured to switch between at least a first resistive state and a second resistive state. The resistive switching portion may include, at least in part, silicon oxide. In some embodiments, the nonvolatile memory elements may also include a third layer formed on top of the second layer. The third layer may be operable as a top electrode.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
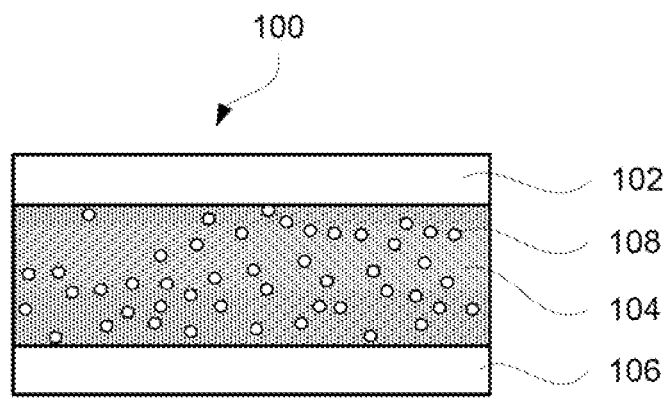
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the resistive switching layer is a dynamic process that is preferably well controlled to prevent over-programming. For example, when the resistive switching layer is switched from its high resistive state (HRS) to its low resistive state (LRS), a rapid drop in resistance associated with this switch may cause an excessive current through the resistive switching layer and an over-programming. The over-programming occurs when change in the resistance continues even after the resistive switching layer reaches its desirable resistance. One approach to prevent over-programming is by using very short pulses, e.g., about 50 nanoseconds, followed by a reading pulse. If the desired resistive state is not reached, another pulse is applied. The process of applying switching and reading pulses may be repeated until the desired resistance is not reached. However, shorter pulses have their own inherent limitations, such as requiring more pulses or higher voltages to achieve the same switching result, which may consume more power than fewer, longer, lower-voltage pulses. Furthermore, even during a relatively short switching pulse, the change in resistance may be sufficiently large to result in current spiking and over-programming. In some embodiments, the difference in resistances between the LRS and the HRS may be more than an order of magnitude to allow the read pulses to easily differentiate between the two states.

To prevent current spiking and over-programming, an embedded resistor is connected in series with the resistive switching layer and is used to limit the current through the resistive switching layer. The embedded resistor effectively functions as a voltage divider within the ReRAM cell. Unlike the resistive switching layer, the embedded resistor maintains a constant resistance throughout the entire operation of the cell. As a relative change of the overall ReRAM cell resistance (expressed as a ratio of the change in the resistance of the ReRAM cell to the overall initial resistance) when the resistive switching layer goes between the LRS and the HRS is less for ReRAM cells with embedded resistors than for similar cells without embedded resistor. This voltage divider/constant resistance characteristic of the embedded resistor helps to prevent the current spiking and over-programming.

Accordingly, an embedded resistor may be used to limit amplitude of an electrical current that passes through a memory element during operation of a resistive random access memory (ReRAM) cell. Conventional embedded resistors typically employ complicated deposition procedures which may include the use of several different deposition techniques and several different vacuum chambers. Accordingly, conventional embedded resistors are complicated to produce and often do not provide sufficient resistivity at a desired thickness with an acceptable thermal stability.

Various embodiments disclosed herein provide resistive switching nonvolatile memory elements that may include one or more resistive layers that each includes a resistive portion operable as an embedded resistor, and a resistive switching portion operable as a resistive switching layer. The resistive portion and resistive switching portion may be integrated as part of the same layer, thus resulting in a simpler manufacturing process in which a single deposition technique may be used to form both the embedded resistor and the resistive switching layer. Thus, both portions may be formed in a single vacuum chamber without a break. Furthermore, the resistive layer may have a high thermal stability and withstand temperatures upwards of 800 degrees Celsius. Moreover, the portions of the resistive layer may be configured to have additional functionalities, thus resulting in a simplified ReRAM cell architecture. For example, the resistive portion may be configured to also be operable as an oxygen vacancy reservoir for the resistive switching portion, thus avoiding the deposition of another oxygen vacancy reservoir layer. Moreover, the resistive portion may also be configured to be operable as a passivated or inert electrode, thus avoiding the deposition of another electrode layer. These and other features will be discussed in greater detail below.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be a reactive electrode and act as a source and as a reservoir of defects for the resistive switching layer. That is, defects may travel through an interface formed by this electrode with the resistive switching layer (i.e., the reactive interface).

Resistive switching layer 104 may be initially formed from a dielectric material and later made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
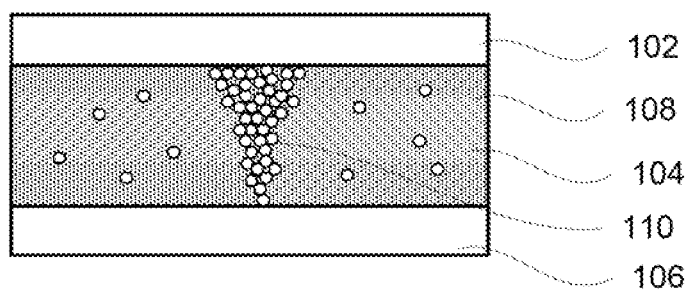
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B, without requiring a phase change of the layer. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
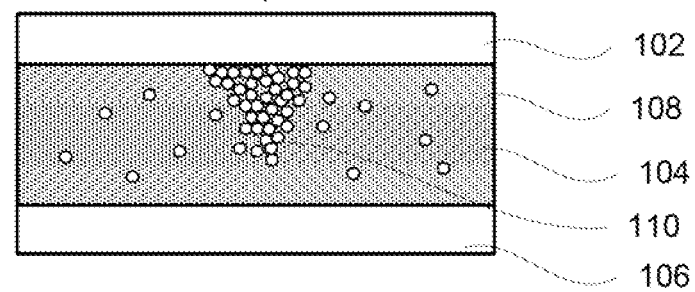

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistive state (LRS), while the state illustrated in FIG. 1C is referred to as a high resistive state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
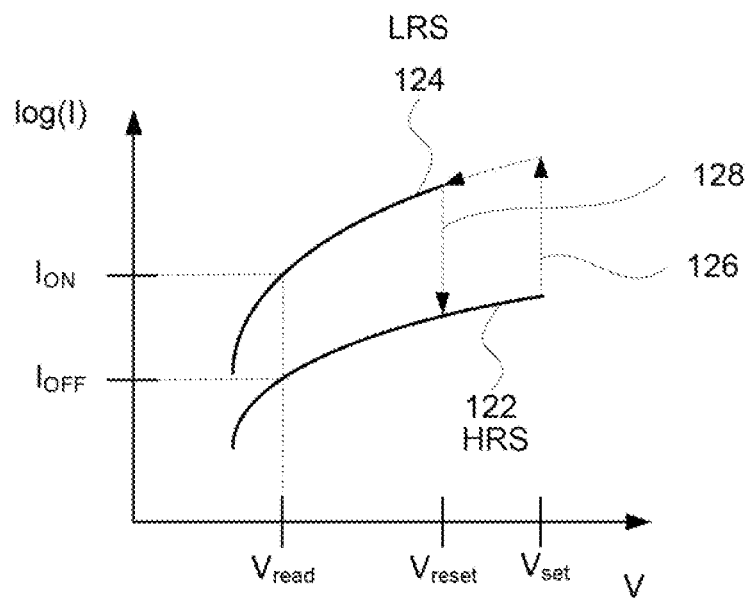
FIG. 2A illustrates a plot of a current passing through a unipolar ReRAM cell as a function of a voltage applied to the ReRAM cell, in accordance with some embodiments.
Figure 2B:
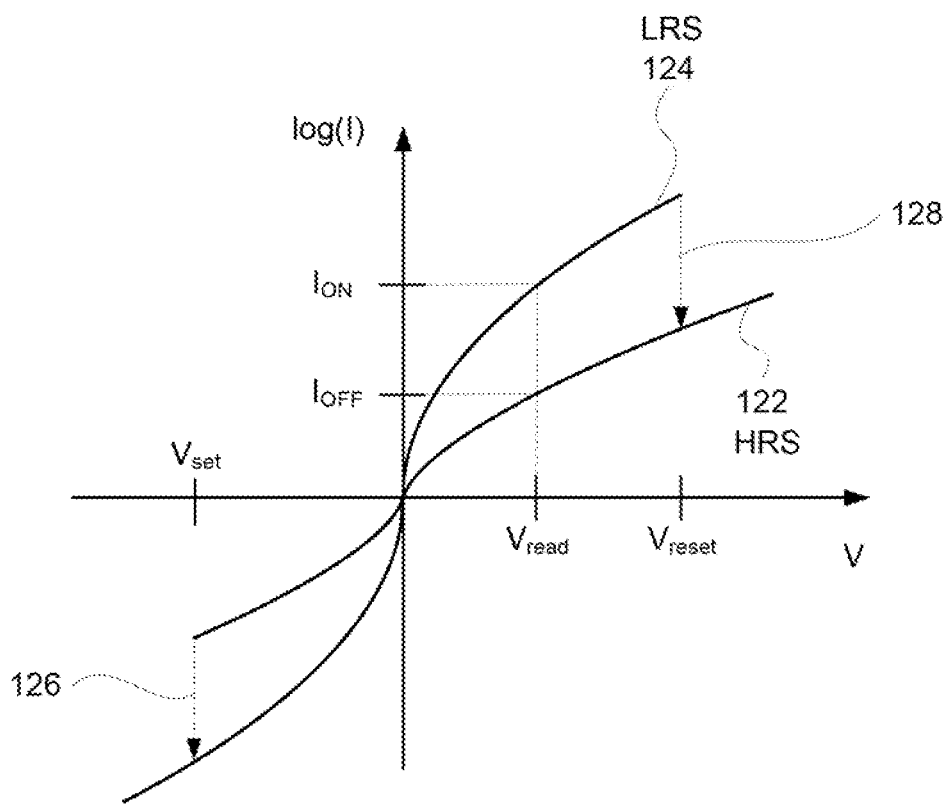
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistive states may be used to store one bit of data. It should be noted that some ReRAM cells may have three and even more resistive states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In high density memory applications, the read currents ($I_{ON}$ and $I_{OFF}$) may be between about 50 nA and 500 nA, thus enabling low voltage operation. In some embodiments, for low density memory applications, the read currents may be between about 100 nA and 5 mA. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Examples of ReRAM Cells

Figure 3:
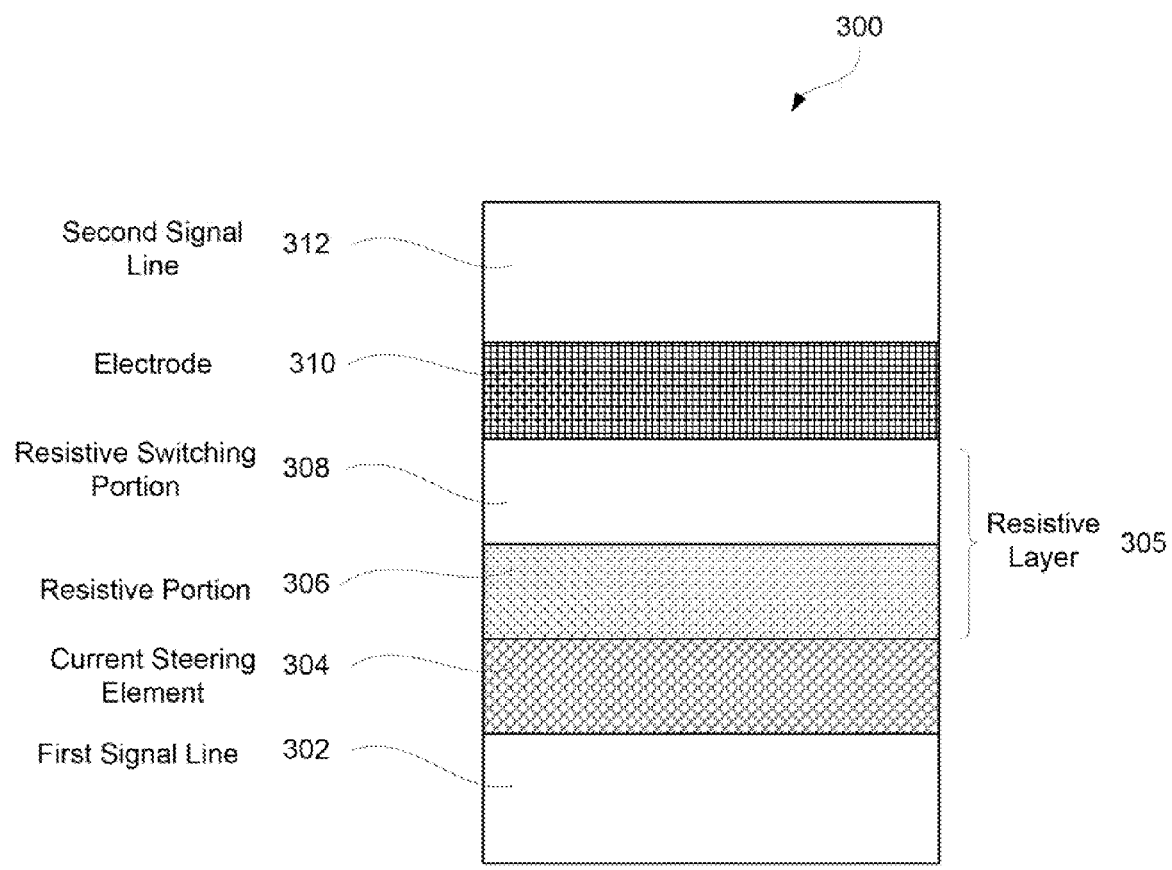
FIG. 3 illustrates a schematic representation of a ReRAM cell including an embedded resistor, resistive switching layer, and other components, in accordance with some embodiments.

FIG. 3 illustrates a schematic representation of a ReRAM cell 300, in accordance with some embodiments. ReRAM cell 300 may include a first signal line 302, a current steering element 304, a resistive layer 305, an intermediate electrode 310, and a second signal line 312. In some embodiments, resistive layer 305 may include a resistive portion 306 and a resistive switching portion 308. It will be appreciated that "first" and "second" terminology is used herein only for differentiating reasons and does not imply any deposition order or spatial orientation of the layers unless specifically noted. In some embodiments, ReRAM cell 300 has more or fewer layers. For example, an intermediate layer may be disposed between electrode 310 and resistive layer 305 in order to improve electrical connection between electrode 310 and resistive layer 305. Furthermore, current steering element 304 and/or intermediate electrode 310 may be omitted from ReRAM cell 300.

In the example illustrated in FIG. 3, a portion of current steering element 304 is also operable as another intermediate electrode interfacing resistive layer 305. Likewise, when intermediate electrode 310 is not present, a portion of resistive portion 306 may be operable as an intermediate electrode. In some embodiments, resistive layer 305 is positioned in between and directly interfaces two designated electrodes. Regardless of these configurations, one electrode (standalone or a part of another component) interfacing resistive layer 305 may be an inert electrode and may not exchange defects with resistive layer 305. Another electrode (standalone or a part of another component) that also interfaces resistive layer 305 may be active and may exchange defects with resistive layer 305. For example, a titanium nitride electrode may accept and release oxygen vacancies into resistive layer 305, while a doped polysilicon electrode may form a passivation silicon oxide layer that blocks defects from going in and out of resistive layer 305. In the example illustrated in FIG. 3, current steering element 304 may include a bottom p-doped polysilicon portion and a top n-doped polysilicon portion, which may be operable as an electrode, more specifically, an inert electrode.

In some embodiments, the electrodes may be sufficiently conductive to also be used as signal lines. Alternatively, signal lines and electrodes may be separate components as, for example, illustrated in FIG. 3. First signal line 302 and second signal line 312 provide electrical connections to ReRAM cell 300. For example, first signal line 302 and/or second signal line 312 extend between multiple ReRAM cells, which may be cells provided in the same row or the same column of a memory array as further described below with reference to FIGS. 7A and 7B. First signal line 302 and second signal line 312 may be made from conductive materials, such as n-doped polysilicon, p-doped polysilicon, titanium nitride, ruthenium, iridium, platinum, and tantalum nitride. The signal lines may have a thickness of less than about 100 nanometers (nm), such as less than about 50 nm and even less than about 10 nm. Thinner electrodes may be formed using atomic layer deposition (ALD) techniques.

Current steering element 304, if one is present, may be an intervening electrical component, such as a p-n junction diode, p-i-n diode, metal oxide thin film diode, thin film resistor, octadecyltrichlorosilane, transistor, or other similar device deposited between first signal line 302 and second signal line 312. As such, current steering element 304 is connected in series with resistive portion 306 and resistive switching portion 308. In some embodiments, current steering element 304 may include two or more layers of semiconductor materials, such as two or more doped silicon layers, that are configured to direct the flow of current through the device. Current steering element 304 may be a diode that includes a p-doped silicon layer, an un-doped intrinsic layer, and an n-doped silicon layer. These layers are not specifically identified in FIG. 3. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased). In some embodiments, current steering element 304 may include one or more binary or ternary nitrides. For example, current steering element 304 may include any of titanium nitride, tantalum nitride, tungsten nitride, hafnium nitride, zirconium nitride, tantalum silicon nitride, titanium silicon nitride, hafnium silicon nitride, tungsten silicon nitride, tantalum aluminum nitride, titanium aluminum nitride, tungsten aluminum nitride, and hafnium aluminum nitride.

ReRAM cell 300 may further include resistive layer 305 which may include one or more resistive portions having different functionalities. For example, resistive layer 305 may include resistive portion 306 which may be operable as an embedded resistor. Thus, resistive portion 306 has a substantially constant electrical resistance that does not change during operation of ReRAM cell 300. In this way, resistive portion 306 may be configured to limit a current that flows through layers included in ReRAM cell 300, such as resistive layer 305. In this way, resistive portion may prevent overprogramming of ReRAM cell 300.

In some embodiments, resistive layer 305 may also include resistive switching portion 308 which may be operable as a resistive switching layer. Accordingly, resistive switching portion 308 may be configured to be switched between two or more resistive states, such as a high resistive state and a low resistive state, in response to one or more currents and/or voltages being applied to ReRAM cell 300. In this way, resistive switching portion 308 may be operable to store one or more data values identified by its resistive state.

While described separately, according to some embodiments, resistive portion 306 and resistive switching portion 308 are parts of the same layer which may be formed as part of a single deposition process, as described in greater detail below with reference to FIG. 5 and FIG. 6. In this way, an embedded resistor may be integrated with a switching layer and implemented as a single layer, such as resistive layer 305, within ReRAM cell 300. Accordingly, resistive portion 306 and resistive switching portion 308 may include the same base material, which may be silicon oxide. In this example, resistive switching portion 308 may be made entirely of silicon oxide. Furthermore, resistive portion 306 may include a conductive silicon oxide. For example, resistive portion 306 may include any of chromium silicon oxide, molybdenum silicon oxide, tungsten silicon oxide, niobium silicon oxide, titanium silicon oxide, tantalum silicon oxide, and ruthenium silicon oxide. In some embodiments, the addition of a metal, such as chromium, to silicon oxide increases the resistivity of the layer and provides a substantially constant resistance that has a high thermal stability. For example, resistive portion 306 including chromium silicon oxide may maintain a substantially constant electrical resistance even after an anneal process in which ReRAM cell may be heated to 800 degrees Celsius.

In some embodiments, the conductive silicon oxide of resistive portion 306 may be silicon rich and may have an atomic ratio of oxygen to silicon of less than about 1. Furthermore, silicon oxide of switching portion 308 may be silicon rich and may have an atomic ratio of oxygen to silicon of less than about 1. The use of silicon rich materials for resistive portion 306 may enable resistive portion 306 to be operable as a reservoir of oxygen vacancies during operation of ReRAM cell 300. Accordingly, resistive portion 306 may provide oxygen vacancies for resistive switching portion 308, and no additional layer may be required for an oxygen vacancy reservoir. In some embodiments, resistive portion 306 may have a thickness of about 10 nm, and resistive switching portion 308 may have a thickness of between about 1 nm to 2 nm. Moreover, according to some embodiments, a boundary or interface between resistive portion 306 and resistive switching portion 308 is not a discrete boundary, but is instead a gradient from one material to another in which a concentration of a metal of the conductive silicon oxide is varied. For example, the interface between resistive portion 306 and resistive switching portion 308 is a gradual transition from 100% conductive silicon oxide, such as chromium silicon oxide, to 50% conductive silicon oxide/50% silicon oxide, and then to 100% silicon oxide. In this way, the interface between resistive portion 306 and resistive switching portion 308 may be a gradual transition between their respective materials.

Accordingly, a resistive layer may include resistive switching portion 308 as well as an integrated embedded resistor, such as resistive portion 306. The integration of the embedded resistor within the resistive switching layer as disclosed herein may result in a simplified manufacturing process, as described below with reference to FIG. 5 and FIG. 6, as well as a simplified ReRAM cell design.

Electrode 310 may be fabricated from a conductive material that has a desirable conductivity and work function, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, electrode 310 may be formed from titanium, tantalum, or aluminum. Electrode 310 may be between about 5 nm and about 500 nm thick or, more specifically, between about 10 nm and about 100 nm thick.

Figure 4:
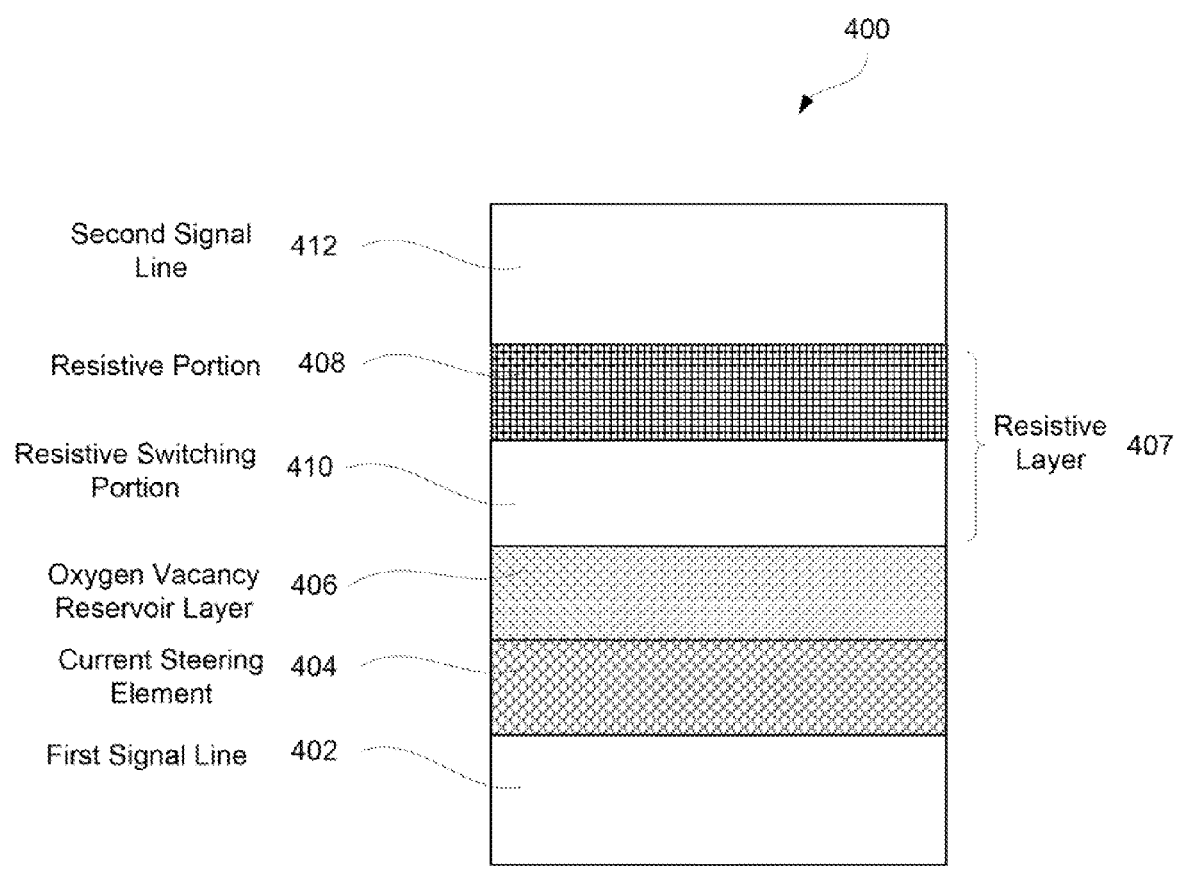
FIG. 4 illustrates a schematic representation of another ReRAM cell including an embedded resistor, resistive switching layer, and other components, in accordance with some embodiments.

FIG. 4 illustrates a schematic representation of another ReRAM cell including an embedded resistor, resistive switching layer, and other components, in accordance with some embodiments. As similarly discussed above with reference to FIG. 3, ReRAM cell 400 may include first signal line 402, second signal line 412, current steering element 404, resistive layer 407. ReRAM cell 400 may further include oxygen vacancy reservoir layer 406 which may be a layer operable to provide a reservoir of oxygen vacancies during operation of ReRAM cell 400. In this way, oxygen vacancy reservoir layer 406 may provide oxygen vacancies to resistive switching portion 410 during operation of ReRAM cell 400. In some embodiments, oxygen vacancy reservoir layer 406 may include a metal oxide, such as hafnium oxide.

As shown in FIG. 4, resistive layer 407 may include resistive portion 408 and resistive switching portion 410. As discussed above with reference to resistive portion 306 and resistive switching portion 308, resistive portion 408 and resistive switching portion 410 may be operable as an embedded resistor a resistive switching layer, respectively. Moreover, resistive portion 408 and resistive switching portion 410 may also be integrated in the same layer and formed as part of the same deposition process. Similarly, resistive portion 408 and resistive switching portion 410 may include the same base material, which may be silicon oxide. Moreover, resistive portion 408 may be made of a conductive silicon oxide. For example, resistive portion 408 may include any of chromium silicon oxide, molybdenum silicon oxide, tungsten silicon oxide, niobium silicon oxide, titanium silicon oxide, tantalum silicon oxide, and ruthenium silicon oxide.

In some embodiments, the conductive silicon oxide of resistive portion 408 may be oxygen rich and may have an atomic ratio of silicon to oxygen of less than about 1. Furthermore, silicon oxide of switching portion 410 may be oxygen rich and may have an atomic ratio of silicon to oxygen of less than about 1. The use of oxygen rich materials for resistive portion 408 may enable resistive portion 408 to be operable as an inert electrode. Accordingly, resistive portion 408 may also be a passivated layer that is operable as an inert electrode, and no additional inert electrode may be required in ReRAM cell 400. In this way, the use of oxygen rich materials may simplify the design of ReRAM cell 400.

As discussed above with reference to FIG. 3, resistive portion 408 may have a thickness of about 10 nm, and resistive switching portion 410 may have a thickness of between about 1 nm to 2 nm. Moreover, according to some embodiments, a boundary or interface between resistive portion 408 and resistive switching portion 410 is not a discrete boundary, but is instead a gradient from one material to another. For example, the interface between resistive portion 408 and resistive switching portion 410 is a gradual transition from 100% chromium silicon oxide to 50% chromium silicon oxide/50% silicon oxide, and then to 100% silicon oxide. In this way, the interface between resistive portion 408 and resistive switching portion 410 may be a gradual transition between their respective materials.

Processing Examples

Figure 5:
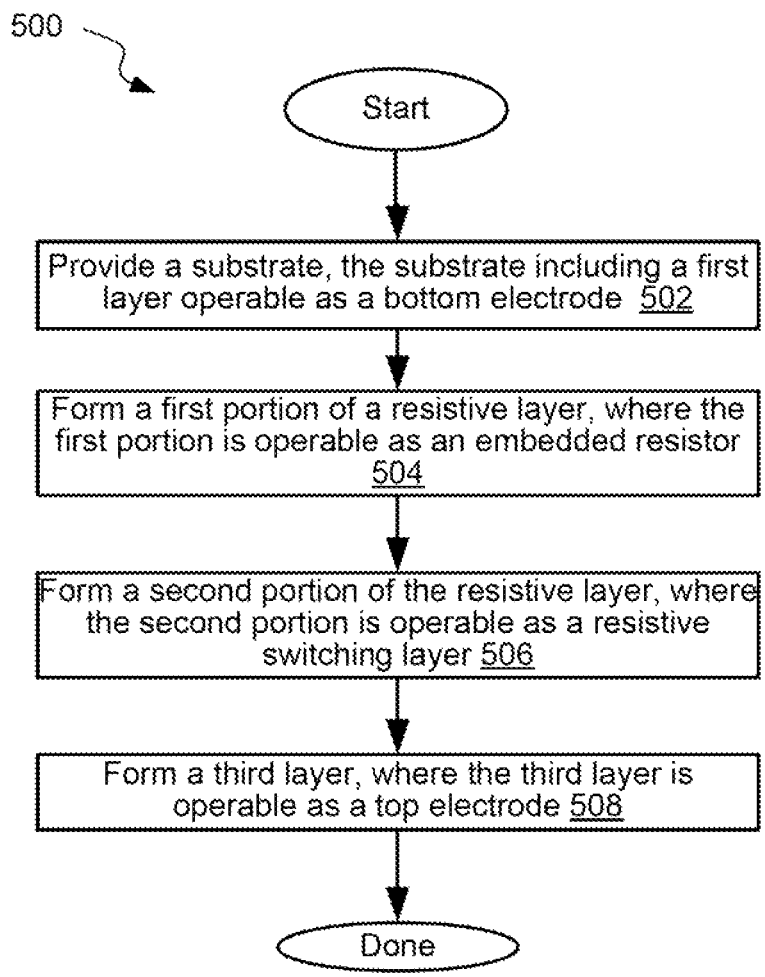
FIG. 5 illustrates a process flowchart corresponding to a method of fabricating a ReRAM cell, in accordance with some embodiments.

FIG. 5 illustrates a process flowchart corresponding to method 500 of fabricating a ReRAM cell, in accordance with some embodiments. Method 500 may commence with providing a substrate during operation 502. The substrate may include one or more components, such as a first signal line, a first electrode, and a current steering element. In other embodiments, method 500 involves forming the first signal line, the first electrode and/or, for example, the current steering element on the substrate, either of which may be operable as an electrode. The signal line can be made of silicon (e.g., doped polysilicon), a silicide, titanium nitride, or other appropriate materials listed elsewhere in this document. For example, a titanium nitride layer may be formed using PVD or other suitable deposition techniques. Deposition of the titanium nitride layer may be performed using a titanium target in a nitrogen atmosphere maintained at a pressure of between about 1-20 millitorr. The power may be maintained at 150-500 Watts/cm$^2$ with resulting in a deposition rate of about 0.05-0.5 nm per second. These process parameters are provided as examples and generally depend on deposited materials, tools, deposition rates, and other factors. Other processing techniques, such as ALD, PLD, CVD, evaporation, and the like can also be used to deposit the first signal line and, in some embodiments, the current steering element.

Method 500 may proceed with forming a first portion of a resistive layer during operation 504. As similarly discussed above with reference to FIG. 3, the first portion of the resistive layer may be a resistive portion that is operable as an embedded resistor and may be made of a material, such as any of chromium silicon oxide, molybdenum silicon oxide, tungsten silicon oxide, niobium silicon oxide, titanium silicon oxide, tantalum silicon oxide, and ruthenium silicon oxide. The resistive portion may be silicon rich and have an atomic ratio of oxygen to silicon of less than about 1. As discussed above, the use of a silicon rich conductive silicon oxide enables the first portion of the resistive layer to be operable as an oxygen vacancy reservoir as well as an embedded resistor. Furthermore, the first portion of the resistive layer may have a thickness of about 10 nm. The first portion of the resistive layer may be formed directly over the substrate or current steering element, if included. Thus, the first portion of the resistive layer may directly interface the current steering element. In some embodiments, the first portion of the resistive layer may or may not be separated by one or more other layer, e.g., an interface layer.

Any suitable deposition technique may be used to form the first portion of the resistive layer, such as an atomic layer deposition (ALD) process or a physical vapor deposition (PVD) process. Other processing techniques, such as pulsed laser deposition (PLD), chemical vapor deposition (CVD), evaporation, and the like may also be used to deposit the first portion of the resistive layer. For example, a chemical vapor deposition process may be used in which the substrate is exposed to one or more precursors including silicon and chromium. In another example, an atomic layer deposition process may be used in which a substrate is exposed to a chromium containing precursor and subsequently exposed to a silicon containing precursor. In yet another example, a physical vapor deposition process may be used which may include sputtering a chromium containing target and a silicon containing target. It will be appreciated that precursors and/or targets may be used for other metals as well, such as precursors and/or targets for molybdenum, tungsten, niobium, titanium, tantalum, and ruthenium.

Method 500 may proceed with forming a second portion of the resistive layer during operation 506. As similarly discussed above with reference to FIG. 3, the second portion of the resistive layer may be a resistive switching portion that is operable as resistive switching layer and may be made of a material such as silicon oxide that may be silicon rich and have an atomic ratio of oxygen to silicon of less than about 1. Furthermore, the second portion of the resistive layer may have a thickness of between about 1 nm and 2 nm. The second portion of the resistive layer may be formed as part of the same deposition process as the first portion and may be integrated with the first portion in the same layer. Accordingly, the deposition technique used to form the first portion may also be used to form the second portion of the resistive layer. For example, a chemical vapor deposition process may be used in which the substrate is exposed to one or more precursors including silicon. In another example, an atomic layer deposition process may be used in which a substrate is exposed to a silicon containing precursor. In yet another example, a physical vapor deposition process may be used which may include sputtering a silicon containing target. In this way, forming the resistive portion and the resistive switching portion of a resistive layer may be part of a same continuous deposition operation, and operation 504 and operation 506 may be part of the same deposition process.

As discussed above, the deposition process may be a physical vapor deposition process. In this example, forming the second portion may include reducing a ratio of power applied to the chromium containing target to power applied to the silicon containing target. The relative powers may be adjusted to form a gradient in the concentration of chromium and a corresponding gradient in the interface between the first portion and the second portion of the resistive layer. It will be appreciated that while a chromium containing target has been described, targets may be used for other metals as well, such as targets for molybdenum, tungsten, niobium, titanium, tantalum, and ruthenium.

Method 500 may proceed with forming a third layer that is operable as a top electrode during operation 508. As discussed above with reference to FIG. 3, the third layer may be made from a conductive material that has a desirable conductivity and work function, such as p-type polysilicon, n-type polysilicon, transition metals, transition metal alloys, transition metal nitrides, or transition metal carbides. For example, the third layer may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). The third layer may have a thickness of between about 5 nm and about 500 nm. Any suitable deposition process may be used to form the third layer.

Figure 6:
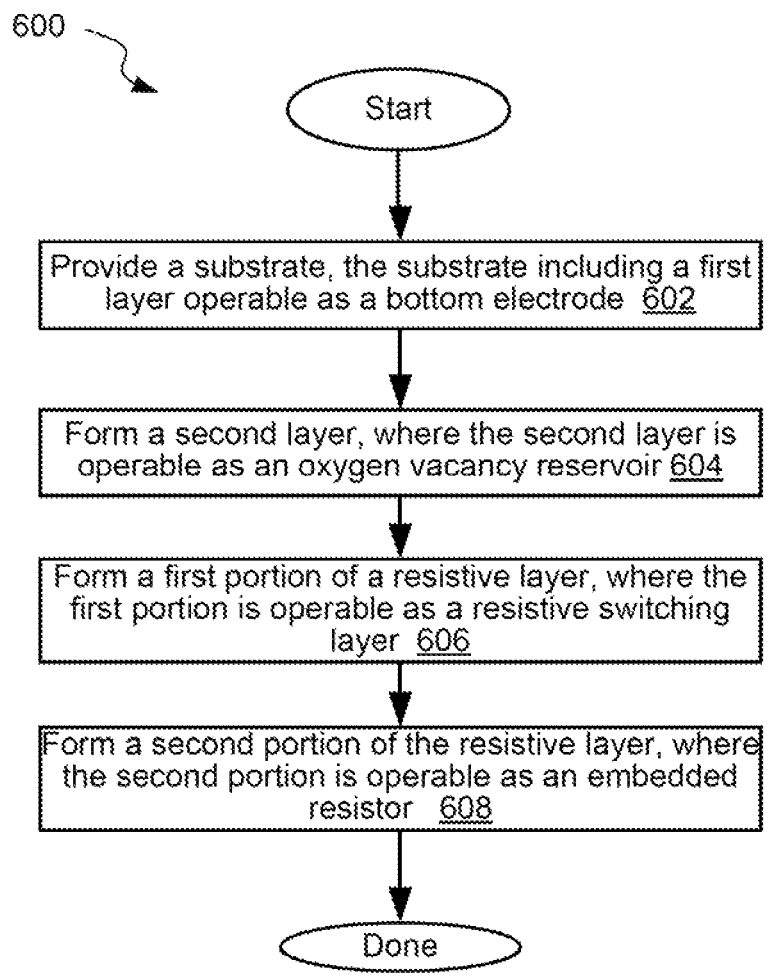
FIG. 6 illustrates a process flowchart corresponding to a method of fabricating another ReRAM cell, in accordance with some embodiments.

FIG. 6 illustrates a process flowchart corresponding to a method of fabricating another ReRAM cell, in accordance with some embodiments. As discussed above with reference to FIG. 5, method 600 may commence with providing a substrate during operation 602. The substrate may include one or more components, such as a first signal line, first electrode, and a current steering element. In other embodiments, method 600 involves forming the first signal line and, for example, the current steering element on the substrate, either of which may be operable as an electrode.

Method 600 may proceed with forming an oxygen vacancy reservoir layer during operation 604. As discussed above with reference to FIG. 4, an oxygen vacancy reservoir layer may be a layer operable to provide a reservoir of oxygen vacancies during operation of a ReRAM cell. In some embodiments, the oxygen vacancy reservoir layer may include a metal oxide, such as hafnium oxide. The oxygen vacancy reservoir layer may be formed using PVD or other suitable deposition techniques. For example, hafnium oxide may be deposited using a PVD target that includes hafnium. It will be appreciated that other processing techniques, such as ALD, PLD, CVD, evaporation, and the like may also be used.

Method 600 may proceed with forming a first portion of a resistive layer during operation 606. As similarly discussed above with reference to FIG. 4, the first portion of the resistive layer may be a resistive switching portion that is operable as resistive switching layer and may be made of a material, such as silicon oxide that may be oxygen rich and have an atomic ratio of silicon to oxygen of less than about 1. Furthermore, the first portion of the resistive layer may have a thickness of between about 1 nm and 2 nm. The first portion of the resistive layer may be formed directly over the substrate or current steering element, if included. Thus, the first portion of the resistive layer may directly interface the current steering element. In some embodiments, the first portion of the resistive layer may or may not be separated by one or more other layer, e.g., an interface layer.

Any suitable deposition technique may be used to form the first portion of the resistive layer, such as an atomic layer deposition (ALD) process or a physical vapor deposition (PVD) process. Other processing techniques, such as PLD, CVD, evaporation, and the like may also be used to deposit the first portion of the resistive layer. For example, a chemical vapor deposition process may be used in which the substrate is exposed to one or more precursors including silicon. In another example, an atomic layer deposition process may be used in which a substrate is exposed to a silicon containing precursor. In yet another example, a physical vapor deposition process may be used which may include sputtering a silicon containing target.

Method 600 may proceed with forming a second portion of the resistive layer during operation 608. As similarly discussed above with reference to FIG. 4, the second portion of the resistive layer may be a resistive portion that is operable as an embedded resistor and may include any of chromium silicon oxide, molybdenum silicon oxide, tungsten silicon oxide, niobium silicon oxide, titanium silicon oxide, tantalum silicon oxide, and ruthenium silicon oxide. The resistive portion may be oxygen rich and have an atomic ratio of silicon to oxygen of less than about 1. As discussed above, the use of an oxygen rich conductive silicon oxide enables the second portion to be operable as an inert electrode as well as an embedded resistor. Furthermore, the second portion of the resistive layer may have a thickness of about 10 nm.

The second portion of the resistive layer may be formed as part of the same deposition process as the first portion and may be integrated with the first portion in the same layer. Accordingly, the deposition technique used to form the first portion may also be used to form the second portion of the resistive layer. For example, a chemical vapor deposition process may be used in which the substrate is exposed to one or more precursors including silicon and chromium. In another example, an atomic layer deposition process may be used in which a substrate is exposed to a chromium containing precursor and subsequently exposed to a silicon containing precursor. In yet another example, a physical vapor deposition process may be used which may include sputtering a chromium containing target and a silicon containing target. In this way, forming the resistive switching portion and the resistive portion of a resistive layer may be part of a same continuous deposition operation, and operation 606 and operation 608 may be part of the same deposition process.

As discussed above, the deposition process may be a physical vapor deposition process. In this example, forming the second portion may include increasing a ratio of power applied to the chromium containing target to power applied to the silicon containing target. The relative powers may be adjusted to form a gradient in the concentration of chromium and a corresponding gradient in the interface between the first portion and the second portion of the resistive layer. It will be appreciated that while precursors and/or targets have been described for chromium, precursors and/or targets may be used for other metals as well, such as targets for molybdenum, tungsten, niobium, titanium, tantalum, and ruthenium.

Memory Array Examples

Figure 7A:
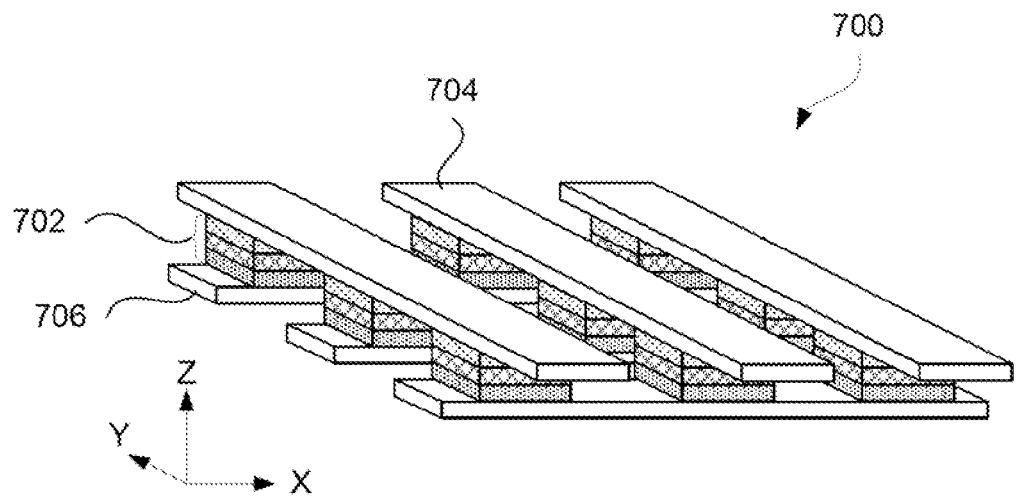
FIGS. 7A and 7B illustrate schematic views of memory arrays including multiple ReRAM cells, in accordance with some embodiments.

A brief description of memory arrays will now be described with reference to FIGS. 7A and 7B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 7A illustrates a memory array 700 including nine ReRAM cells 702, in accordance with some embodiments. In general, any number of ReRAM cells may be arranged into one array. Connections to each ReRAM cell 702 are provided by signal lines 704 and 706, which may be arranged orthogonally to each other. ReRAM cells 702 are positioned at crossings of signal lines 704 and 706 that typically define boundaries of each ReRAM cell in array 700.

Signal lines 704 and 706 are sometimes referred to as word lines and bit lines. These lines are used to read and write data into each ReRAM cell 702 of array 700 by individually connecting ReRAM cells to read and write controllers. Individual ReRAM cells 702 or groups of ReRAM cells 702 can be addressed by using appropriate sets of signal lines 704 and 706. Each ReRAM cell 702 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 704 and 706.

As stated above, various read and write controllers may be used to control operations of ReRAM cells 702. A suitable controller is connected to ReRAM cells 702 by signal lines 704 and 706 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 700 or each ReRAM cell 702. For example, to avoid the parasitic-path-problem, i.e., signal bypasses by ReRAM cells in their low resistive state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 7B:
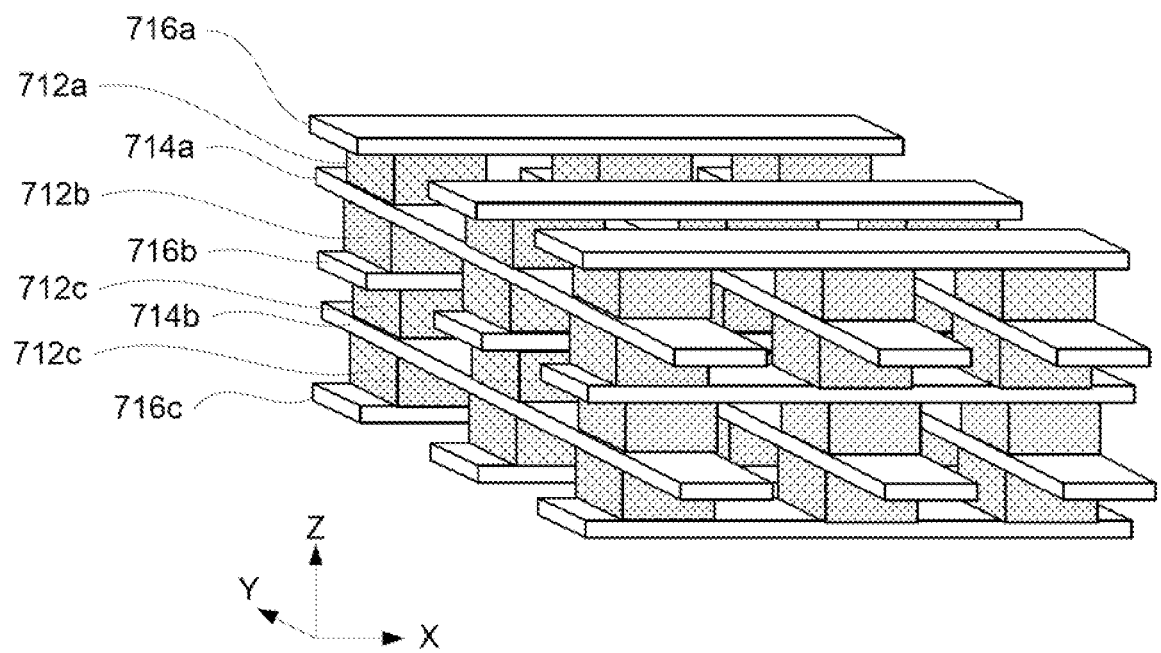

In some embodiments, a memory device may include multiple array layers as, for example, illustrated in FIG. 7B. In this example, five sets of signal lines 714a-b and 716a-c are shared by four ReRAM arrays 712a-c. As with the previous example, each ReRAM array is supported by two sets of signal lines, e.g., array 712a is supported by 714a and 716a.

However, middle signal lines 714a-b and 716b, each is shared by two sets ReRAM arrays. For example, signal line set 714a provides connections to arrays 712a and 712b. First and second sets of signal lines 716a and 716c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a resistive switching nonvolatile memory element, the method comprising:
    forming a first layer on a substrate, the first layer operable as a bottom electrode;
    forming a second layer above the first layer, the second layer comprising a resistive portion and a resistive switching portion,
        wherein the resistive portion has a substantially constant resistance;
        wherein the resistive portion includes a conductive silicon oxide that includes any of chromium silicon oxide, molybdenum silicon oxide, tungsten silicon oxide, niobium silicon oxide, titanium silicon oxide, tantalum silicon oxide, and ruthenium silicon oxide,
        wherein the resistive switching portion is configured to switch between at least a first resistive state and a second resistive state,
        wherein the resistive switching portion comprises silicon oxide; and
    forming a third layer above the second layer, the third layer operable as a top electrode.

2. The method of claim 1, wherein the conductive silicon oxide of the resistive portion of the second layer is silicon rich and has an atomic ratio of oxygen to silicon of less than about 1.

3. The method of claim 1, wherein the silicon oxide of the resistive switching portion of the second layer is silicon rich and has an atomic ratio of oxygen to silicon of less than about 1.

4. The method of claim 1, wherein the forming of the resistive portion of the second layer and the forming of the resistive switching portion of the second layer are parts of a continuous deposition operation.

5. The method of claim 4, wherein the continuous deposition operation is a chemical vapor deposition process, and wherein forming the second layer comprises exposing the substrate to one or more precursors comprising silicon and chromium.

6. The method of claim 4, wherein the continuous deposition operation is an atomic layer deposition process, and wherein forming the second layer comprises:
    exposing the substrate to a chromium containing precursor; and
    exposing the substrate to a silicon containing precursor.

7. The method of claim 4, wherein the continuous deposition operation is a physical vapor deposition process, and wherein forming the second layer comprises:
    sputtering a chromium containing target and a silicon containing target; and
    reducing a ratio of power applied to the chromium containing target to power applied to the silicon containing target.

8. The method of claim 7, wherein a portion of the second layer between the resistive portion and the resistive switching portion has a gradient concentration of chromium.

9. The method of claim 1, wherein the resistive portion has a thickness of about 10 nm, and wherein the resistive switching portion has a thickness of between about 1 nm to 2 nm.

10. A method for forming a resistive switching nonvolatile memory element, the method comprising:
    forming a first layer on a substrate, the first layer operable as a bottom electrode;
    forming a second layer above the first layer, the second layer comprising a metal oxide capable of providing oxygen vacancies during operation of the resistive switching nonvolatile memory element; and
    forming a third layer above the second layer, the third layer including a resistive portion and a resistive switching portion,
        wherein the resistive portion has a substantially constant resistance,
        wherein the resistive portion comprises a conductive silicon oxide that includes any of chromium silicon oxide, molybdenum silicon oxide, tungsten silicon oxide, niobium silicon oxide, titanium silicon oxide, tantalum silicon oxide, and ruthenium silicon oxide,
        wherein the resistive switching portion is configured to switch between at least a first resistive state and a second resistive state; and,
        wherein the resistive switching portion comprises silicon oxide.

11. The method of claim 10, wherein the conductive silicon oxide of the resistive portion of the third layer is oxygen rich and has a ratio of silicon to oxygen of less than about 1.

12. The method of claim 10, wherein the silicon oxide of the switching portion of the second layer is silicon rich and has a ratio of oxygen to silicon that is less than about 1.

13. The method of claim 10, wherein forming the resistive portion of the third layer and forming the resistive switching portion of the third layer are part of a continuous deposition operation.

14. The method of claim 13, wherein the continuous deposition operation is a chemical vapor deposition process, and wherein forming the third layer comprises exposing the substrate to one or more precursors comprising silicon oxide and chromium.

15. The method of claim 13, wherein the continuous deposition operation is an atomic layer deposition process, and wherein forming the third layer comprises:
    exposing the substrate to a chromium containing precursor; and
    exposing the substrate to a silicon containing precursor.

16. The method of claim 13, wherein the continuous deposition operation is a physical vapor deposition process, and wherein forming the third layer comprises:
    sputtering a chromium containing target and a silicon containing target; and
    increasing a ratio of power applied to the chromium containing target to power applied to the silicon containing target.

17. The method of claim 16, wherein a portion of the third layer between the resistive portion and the resistive switching portion has a gradient concentration of chromium.

18. The method of claim 10, wherein the resistive portion has a thickness of about 10 nm, and wherein the resistive switching portion has a thickness of between about 1 nm to 2 nm.

19. A resistive switching nonvolatile memory element comprising:
- a substrate;
- a first layer formed on the substrate, the first layer operable as a bottom electrode;
- a second layer formed above the first layer, the second layer comprising a resistive portion and a resistive switching portion,
  - wherein the resistive portion has a substantially constant resistance,
  - wherein the resistive portion comprises a conductive silicon oxide that includes any of chromium silicon oxide, molybdenum silicon oxide, tungsten silicon oxide, niobium silicon oxide, titanium silicon oxide, tantalum silicon oxide, and ruthenium silicon oxide,
  - wherein the resistive switching portion is configured to switch between at least a first resistive state and a second resistive state,
  - wherein the resistive switching portion comprises silicon oxide; and
- a third layer formed above the second layer, the third layer operable as a top electrode.

20. The nonvolatile memory element of claim 19, wherein a portion of the second layer between the resistive portion and the resistive switching portion has a gradient concentration of chromium.

* * * * *